United States Patent [19]

Gutierrez et al.

[11] Patent Number: 4,644,096

[45] Date of Patent: Feb. 17, 1987

[54] SURFACE MOUNTING PACKAGE

[75] Inventors: Romulo Gutierrez, Flemington; Albert W. Bauer, Belle Mead, both of N.J.; Thomas L. McDonald, Harleysville, Pa.

[73] Assignee: Alpha Industries, Inc., Woburn, Mass.

[21] Appl. No.: 713,312

[22] Filed: Mar. 18, 1985

[51] Int. Cl.⁴ .............................................. H05K 5/06

[52] U.S. Cl. .................................. 174/52 H; 361/405

[58] Field of Search ................. 174/52 H, 50.6, 50.61, 174/50.62; 361/401, 403, 404, 405, 418; 357/74

[56] References Cited

U.S. PATENT DOCUMENTS

| | | | |
|---|---|---|---|
| 3,061,762 | 10/1962 | Schlegel | 361/405 |
| 3,119,052 | 1/1964 | Tsuji | 174/52 H X |
| 3,234,320 | 2/1966 | Wong | 174/52 FP X |
| 3,351,700 | 11/1967 | Savolainen et al. | 174/52 H X |
| 3,721,868 | 3/1973 | Smith, Jr. | 357/74 X |
| 3,816,847 | 6/1974 | Nagao | 174/52 H X |
| 3,831,066 | 8/1974 | Gabrail | 357/74 |
| 4,463,217 | 7/1984 | Orcutt | 174/52 FP |

*Primary Examiner*—A. T. Grimley
*Assistant Examiner*—D. A. Tone
*Attorney, Agent, or Firm*—Charles Hieken

[57] ABSTRACT

A modified TO-8 package has a kovar header supporting an FET amplifier hermetically sealed by a cover welded along the seam between the cover edge and header edge. The header is formed with three circular openings in space quadrature about the package axis. A circular copper spacer contacts the header and is formed with channels extending radially outward from the header openings to define with the openings three lead channels. A lead having a right angle bend is seated in each channel having an upstanding pin portion above the header. The volume between the lead and the header is filled with hermetically sealing low expansion borosilicate glass. The remainder of each channel is filled or coated with nonconductive epoxy. The depending portions of the leads are flush with the bottom of the copper spacer. In another form the base and cover are rectangular in the form of a four-lead DIP package also having the channels, right-angle-bent leads flush with the bottom surrounded by hermetically sealing insulating low expansion borosilicate glass.

13 Claims, 9 Drawing Figures

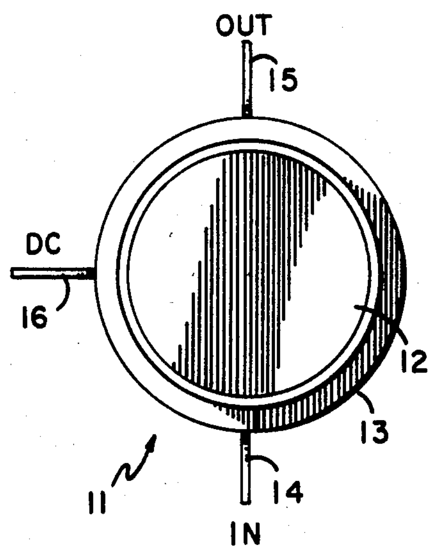
FIG. 1A
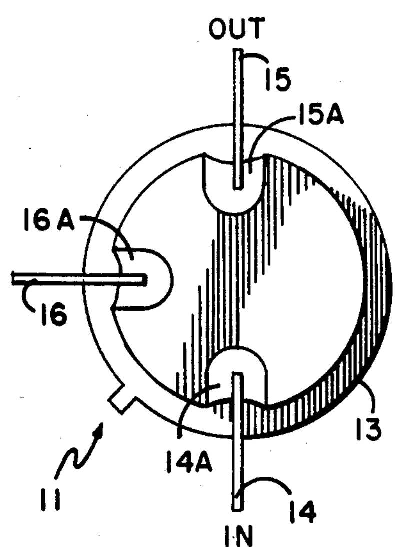
FIG. 1B
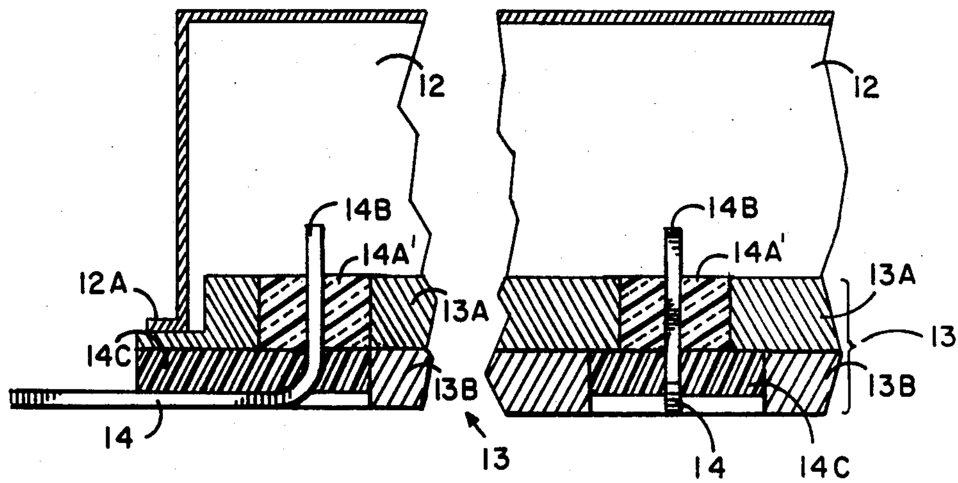
FIG. 2A
FIG. 2B
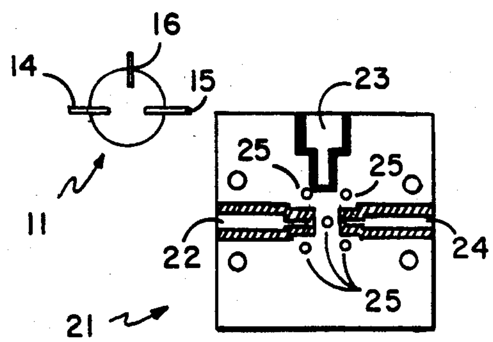
FIG. 3

COMPARISON IN GAIN RESPONSE OF TO-8 AND SMTO-8 PACKAGE. FET AMPLIFIER

SURFACE MOUNTING PACKAGE

The present invention relates in general to surface mounting and more particularly concerns novel apparatus and techniques for surface mounting any electronic package to a printed circuit board or ceramic substrate mother board using conventional infrared reflow or vapor phase soldering techniques or with conductive epoxies reliably at relatively low cost. A specific form of the invention represents an improvement of the old reliable TO-8 package.

The TO-8 package typically comprises a header with depending leads which may or may not include a stud for fastening the package to a circuit board or chassis.

It is an important object of the invention to provide an improved surface mounted package.

According to the invention, there is base plate means for supporting a substrate with electronic circuitry and cover means coacting with the base means and other elements for hermetically sealing the substrate. Preferably the base means comprises a Kovar cobalt-nickel-iron alloy header in electrical and thermal contact with a copper spacer. A plurality of insulatedly separated conducting leads form a right angle bend having an upstanding portion terminating in a pin portion above the base means for electrical connection to a substrate lead. Each lead passes through an opening in the base means filled with hermetically sealing electrically insulating material, such as glass, and includes a portion parallel to the plane of the base means terminating in a connection portion extending beyond the base means and the insulating sealing material for connection to an external conductor. In one form of the invention, the invention comprises a header with the physical dimensions of a standard TO-8 package. In another form, the invention comprises a metal sealed dual in-line (DIP) package.

Numerous other features, objects and advantages of the invention will become apparent from the following specification when read in connection with the accompanying drawing in which:

FIGS. 1A and 1B are top and bottom views, respectively, of an embodiment of the invention in TO-8 form;

FIGS. 2A and 2B are fragmentary side and front sectional views, respectively, of the embodiment of FIGS. 1A and 1B showing details of the relationship among the different elements;

FIG. 3 shows a plan view of a printed circuit board portion for surface mounting the embodiment of FIGS. 1A and 1B;

Figure 4:
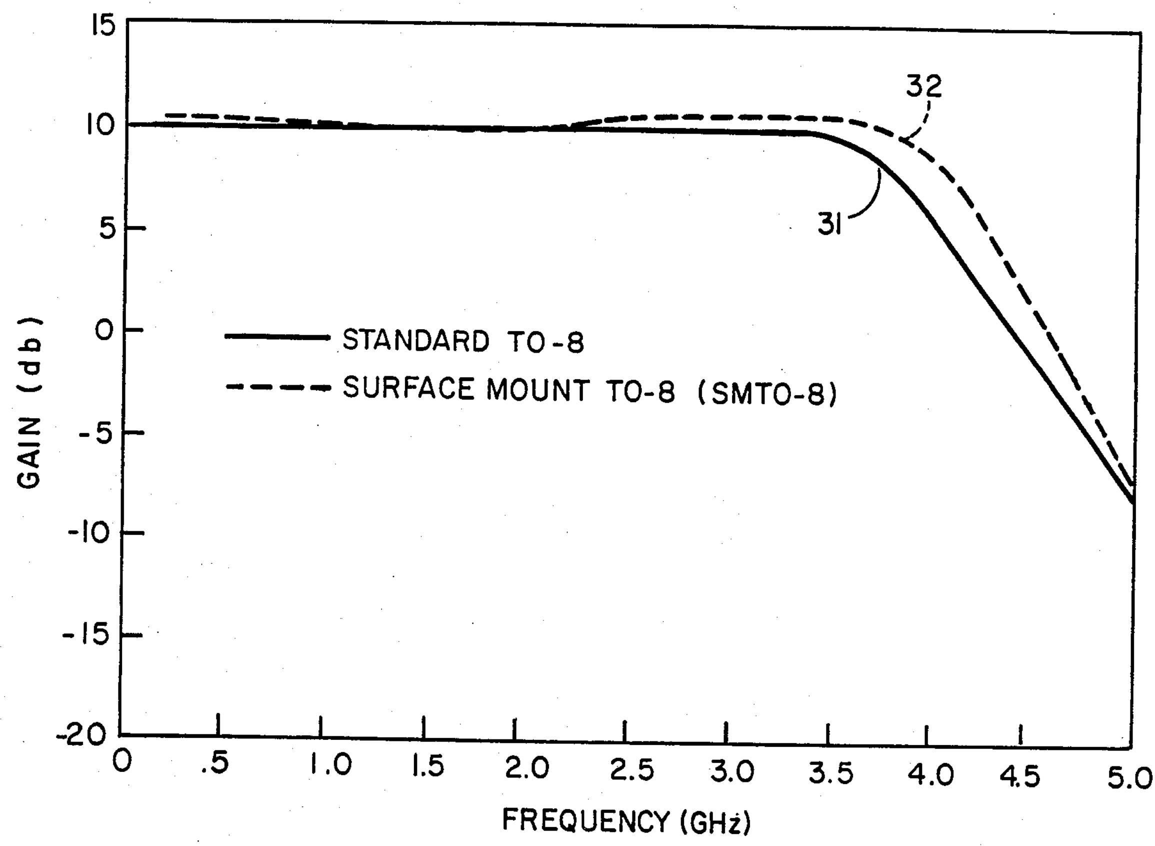
FIG. 4 is a graphical representation of gain as a function of frequency for a standard TO-8 package and a surface mounted SMTO-8 package according to the invention showing the improvement achieved with the present invention for a microwave FET amplifier.

With reference now to the drawing and more particularly FIGS. 1A and 1B thereof, there are shown top and bottom views, respectively, of an embodiment of the invention including a microwave FET amplifier in a package having the same physical dimensions as a TO-8 package but modified according to the invention. Package 11 includes a cover 12 and base 13 with input lead 14, output lead 15 and D.C. lead 16 extending outside cover 12 and base 13 orthogonal to the axis of the package with the bottom of each lead substantially in the plane of the bottom surface of base 13. The leads are insulatedly separated from each other and base 13 by nonhermetic epoxy sealing insulating regions 14A, 15A and 16A, respectively.

Referring to FIGS. 2A and 2B, there are shown fragmentary side and front sectional views, respectively, to better illustrate structural details of the relationship between each lead and the other structure. Only lead 14 and associated structure is shown; however, the structure associated with the other leads is the same. Each lead, such as 14, is preshaped with a 90° radius bend and is glassivated by normal glass seal techniques to provide a hermetically sealing insulating glass element, such as 14A', that insulates each lead from base 13 and each other. Base 13 comprises a Kovar header 13A, to which the flange 12A of cover 12 is hermetically sealed, and copper spacer 13B. The upstanding portion of pin 14B may be connected to appropriate leads in the FET device that may be seated on header 13A. Insulator 14A is circular at the top to fill the round opening in header 13A and of generally rectangular cross section 14C at the bottom with width slightly greater than the diameter of the circular portion at the top to fill the channel in copper spacer 13B with the bottom of each lead substantially flush with the bottom of copper spacer 13.

Some typical dimensions are 0.45 inches for the diameter of cover 13, 0.20-0.22 inches for its height, 0.5 inches for the outside diameter of header 13A and 0.420 inches for copper spacer 13B, 0.03 inches for the height of copper spacer 13B, 0.016-0.019 inches for the diameter of leads 14, 15 and 16 and 0.1 inches for the width of the channels in copper spacer 13B containing the nonconductive epoxy insulating material, the semicircular end being 0.05 inch radius, the transverse separation between centers being 0.15 inch.

Referring to FIG. 3, there is shown a circuit board portion especially suitable for receiving the package 11 of FIG. 1 shown to the upper left prior to being seated on circuit board portion 21, typically 1/32 inch thick Teflon fiberglass printed circuit board having conductors 22, 23 and 24 for contacting leads 14, 16 and 15, respectively. Circuit board 21 is also formed with five grounding holes 25 positioned as shown so that solder flowing therein may establish conductive contact with copper spacer 13B of FIG. 1 with leads 14, 15 and 16 soldered to conductors 22, 24 and 23, respectively. The circuit board can alo be similarly constructed using a variety of other available substrate materials such as Alumina, BeO, Duroid and other suitable materials.

Referring to FIG. 4, there is shown a graphical representation of the gain response of an Alpha Industries AH 5028A GaAsFET amplifier in a standard TO-8 package 31 and the response 32 of this amplifier in a surface mounted package according to the invention. Up to 2 GHz, the gain of the amplifier packaged in the surface mounted package according to the invention is equal to or only slightly greater than that of the standard TO-8 package. Above 2 GHz the gain of the amplifier in the surface mounted package according to the invention is slightly higher by 0.5 dB through 3.5 GHz, and from 3.5 GHz to 5.0 GHz the variation increases to a maximum of 3 dB. The improved gain is believed to result from the difference in the reactive matching between the fixtures for holding the devices and the package parasitics.

Figure 5:
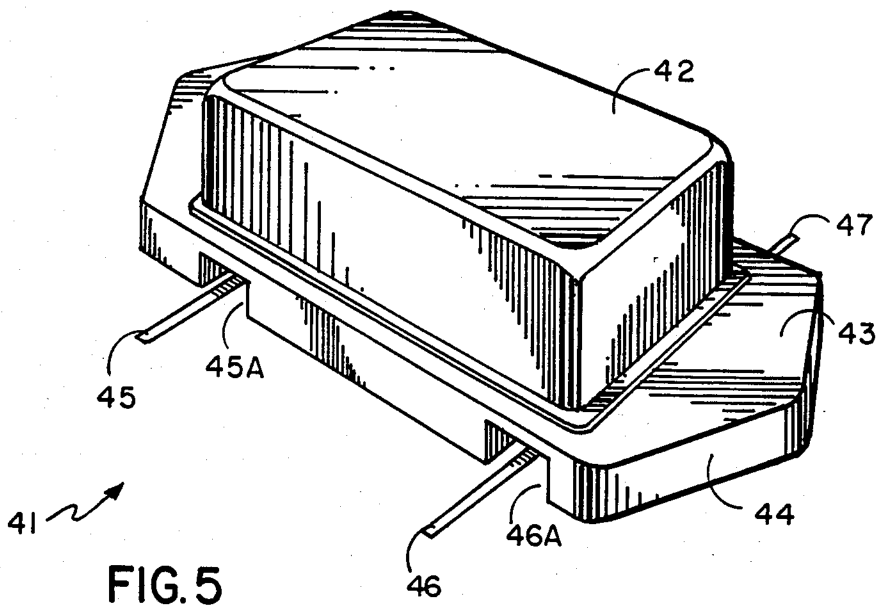
FIG. 5 is a perspective view of an embodiment of the invention in the form of a metal sealed DIP package.

Referring to FIG. 5, there is shown a perspective view of another embodiment of the invention showing a four-lead all metal sealed surface mounted DIP package 41 having a rectangular cover 42 on a header 43 in contact with a copper spacer 44. Three of the leads 45, 46 and 47 are visible, each surrounded by hermetically sealing insulating glass, when passing through header 43 and protected from copper spacer 44 by nonconductive epoxy when passing through regions 45A and 46A, each lead having a right-angle bend as shown in FIGS. 2A and 2B with a pin portion at the top for connection to the hermetically sealed circuit inside.

The leads on the devices may be cut almost flush with the package to provide maximum packaging density. An advantage of the packaging technique according to the invention is that virtually all present designs can immediately be adapted to using the surface mounted packaging according to the invention, the internal connections and area being exactly the same as conventional packages.

Figure 6:
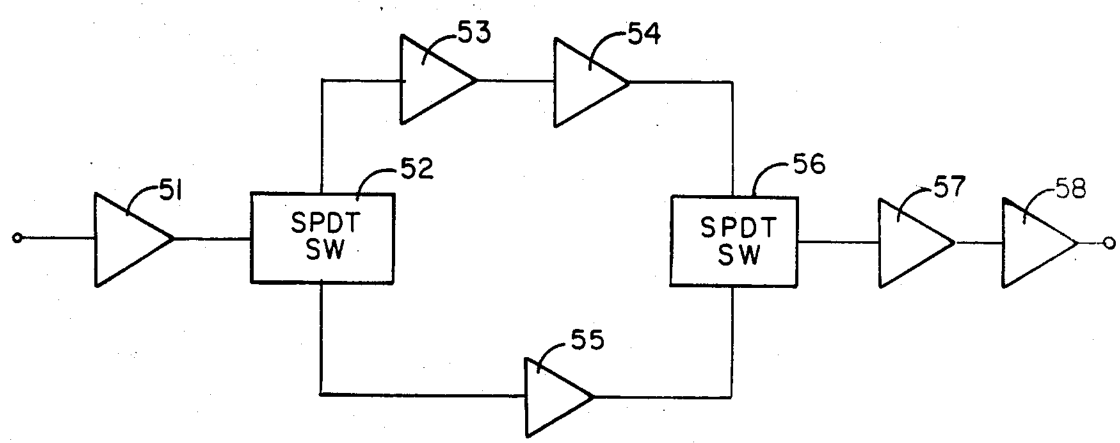
FIG. 6 is a block diagram illustrating the logical arrangement of a switchable gain subassembly.

Referring to FIG. 6, there is shown a block diagram illustrating the logical arrangement of a switchable gain subassembly according to the invention especially suitable for implementing in surface mounted packages according to the invention. This system includes an input FET amplifier 51 having its output selectively connected by input single-pole double-throw switch 52 to a high gain channel comprising cascaded FET amplifiers 53 and 54 or a low gain channel comprising FET amplifier 55. The outputs of amplifiers 54 and 55 are selectively connected by output single-pole double-throw switch 56 to cascaded output FET amplifiers 57 and 58.

Figure 7:
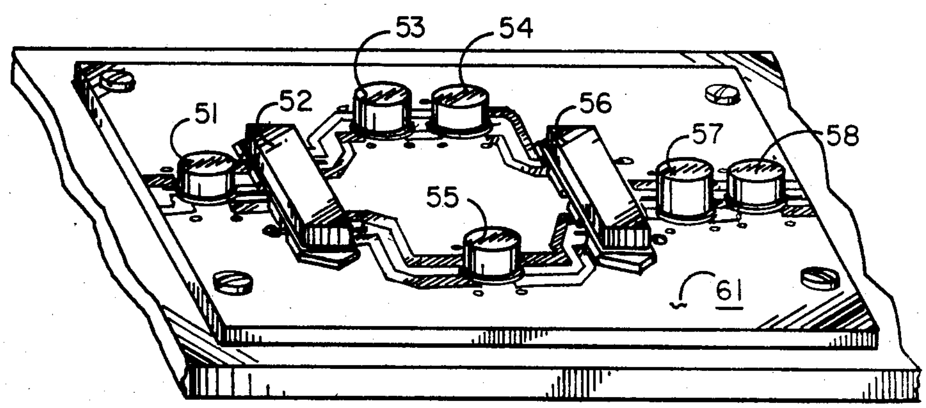
FIG. 7 is a perspective view of the subassembly of FIG. 6 surface mounted on a multilayer printed circuit board in accordance with the principles of the invention.

Referring to FIG. 7, there is shown a perspective view of the physical arrangement of the components in the system of FIG. 6 mounted on a multilayer printed circuit board 61 with the FET amplifiers and the switches being in surface mounted packages according to the invention.

The invention thus represents a modification of standard TO-8 and dual in-line packages (DIP) especially useful in RF and microwave surface mounted applications. The invention allows fabrication of a hermetically sealed package with resistance welding (projection or seam welding) utilizing presently available equipment and tooling. The structural changes provide channels for signals and power which allows the package to be mounted to the surface of the mother board instead of through the board in accordance with conventional techniques while providing an optimum impedance match to the internal circuit and the transmission lines connected to the unit. The glassivated terminals in the base achieve good insulation and an excellent hermetic seal, while the epoxy in the channel provides excellent isolation from the spacer; this material also isolates the leads during the assembly process. A still further advantage is the improved thermal path to the mother board through the copper spacer as compared to typical prior art leadless or leaded chip carriers used for surface mounting applications.

Surface mounting allows fabrication on the circuits on the single surface, thereby simplifying the printed circuit board and the mechanical supporting assembly. Furthermore, the surface mounted components allow the use of automatic handling and insertion machines to reduce labor costs. Still another advantage is the low profile in housing height. A further advantage is the availability of close interconnection spacing when necessary.

There has been described novel apparatus and techniques for surface mounting components. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A hermetically sealed surface mounting package comprising, base means for supporting an electrical circuit, said base means being formed with a plurality of openings for accommodating conducting leads and having a planar outer conducting surface, cover means for covering an electrical circuit seated on said base means hermetically sealed to said base means, a plurality of conducting leads each seated in a respective one of said openings and having an upstanding portion extending above said base means for providing an electrical connection to said electrical circuit and a depending portion substantially flush with said outer conducting surface and having a bottom surface uncovered by insulating material for establishing conductive contact with external conducting leads in a circuit board, and hermetically sealing insulating means filling said openings around said leads for insulatedly separating said leads from said base means and each other and coacting with said base means and said cover means to hermetically seal the region between said base means and said cover means.

2. A hermetically sealed surface mounting package in accordance with claim 1 wherein said upstanding and depending portions are mutually perpendicular.

3. A hermetically sealed surface mounting package in accordance with claim 2 wherein said base means comprises a header of cobalt-nickel-iron alloy in hermetically sealed relationship to said cover means around the perimeter of each and a copper spacer having said outer conducting surface.

4. A hermetically sealed surface mounting package in accordance with claim 2 wherein said insulating means comprises low expansion borosilicate glass.

5. A hermetically sealed surface mounting package in accordance with claim 1 wherein said base means comprises a header of cobalt-nickel-iron alloy in hermetically sealed relationship to said cover means around the perimeter of each and a copper spacer having said outer conducting surface.

6. A hermetically sealed surface mounting package in accordance with claim 5 wherein said insulating means comprises low expansion borosilicate glass.

7. A hermetically sealed surface mounting package in accordance with claim 6 wherein said cover means and said base means are circular.

8. A hermetically sealed surface mounting package in accordance with claim 6 wherein said base means and said cover means are substantially rectangular.

9. A hermetically sealed surface mounting package in accordance with claim 1 and further comprising, circuit board means for mounting said package having a plurality of conductors for conducting contact with respective ones of said leads, and an area embraced by the ends of said conducting strips formed with a plurality of openings for receiving conducting material to establish conductive contact with said outer conducting surface.

10. Apparatus in accordance with claim and further comprising, at least another of said hermetically sealed surface mounting packages seated on said circuit board means.

11. A hermetically sealed surface mounting package in accordance with claim 1 wherein said insulating means comprises low expansion borosilicate glass.

12. A hermetically sealed surface mounting package in accordance with claim 1 wherein said cover means and said base means are circular.

13. A hermetically sealed surface mounting package in accordance with claim 1 wherein said base means and said cover means are substantially rectangular.

* * * * *